US005287054A

United States Patent [19]
Llewellyn

[11] Patent Number: 5,287,054
[45] Date of Patent: Feb. 15, 1994

[54] ATTENUATING VOLTAGE FOLLOWER CIRCUIT

[75] Inventor: William D. Llewellyn, San Jose, Calif.

[73] Assignee: National Semiconductor Corporation, Santa Clara, Calif.

[21] Appl. No.: 27,274

[22] Filed: Mar. 5, 1993

[51] Int. Cl.$^5$ ............................................... G05F 3/16
[52] U.S. Cl. ................................... 323/314; 323/315; 307/296.1; 307/296.6
[58] Field of Search .................. 323/313, 314, 315; 307/296.1, 296.6

[56] References Cited

U.S. PATENT DOCUMENTS

| | | | |
|---|---|---|---|
| 4,288,707 | 9/1981 | Katakura | 307/264 |
| 4,553,083 | 11/1985 | Yang | 323/313 |
| 4,942,369 | 7/1990 | Nakagawara et al. | 330/296 |
| 4,954,769 | 9/1990 | Kalthoff | 323/313 |
| 5,140,181 | 8/1992 | Yoshiro | 307/296.1 |
| 5,223,743 | 6/1993 | Nakagawara | 307/296.1 |

Primary Examiner—R. Skudy
Assistant Examiner—Y. Jessica Han
Attorney, Agent, or Firm—Limbach & Limbach

[57] ABSTRACT

An attenuating voltage-follower circuit has an input stage that buffers an input voltage signal, which varies about a reference voltage, to form an intermediate voltage signal without a DC level shift. A reference stage sets a pivot voltage which is equivalent to the reference voltage so that an attentuated voltage signal can be generated in response to the difference in voltage between the intermediate voltage signal and the pivot voltage across a simple voltage divider stage. The voltage difference between the intermediate voltage signal and the pivot voltage generates a divider current which flows through the voltage divider stage. The divider current, if uncorrected for, would shift the DC level of the intermediate voltage signal. A correction stage senses the magnitude and direction of the divider current and both sources a compensation current and sinks a buffer current which offsets the divider current, thereby eliminating the DC level shift produced by the divider current.

25 Claims, 2 Drawing Sheets

ATTENUATING VOLTAGE FOLLOWER CIRCUIT

BACKGROUND OF THE INVENTION

1. Field of the Invention

The present invention relates to voltage-follower circuits and, in particular, to a voltage-follower circuit that generates an attenuated voltage signal that swings around a reference voltage in response to an input voltage signal.

2. Description of the Related Art

A voltage-follower is a circuit that interfaces a high-impedance circuit with a low-impedance load. One application for a voltage-follower is within the voltage to frequency converter block of a phase lock loop. The converter block converts the voltage of an input voltage signal, which represents the frequency difference between a reference signal and an oscillator output signal, into an exponential control current which is utilized to control the frequency of the oscillator.

FIG. 1 shows a schematic diagram of a portion of a conventional converter block 2. As shown in FIG. 1, converter block 2 includes a first voltage-follower stage 4 that generates an intermediate voltage signal $V_M$ at an intermediate node $N_M$ in response to an input voltage signal $V_{IN}$. Voltage-follower 4, which is well-known in the art, provides a high input impedance to isolate converter block 2 from the input voltage signal $V_{IN}$ as well as wide bandwidth and no D.C. voltage level shift. As a result, the intermediate voltage signal $V_M$ is substantially equivalent to the input voltage signal $V_{IN}$.

Converter block 2 also includes a reference stage 6 that generates a pivot voltage $V_P$ at a pivot node $N_P$. The pivot voltage $V_P$ is typically selected to represent the approximate midpoint of the range of input voltage signals $V_{IN}$. Thus, as the input voltage signal $V_{IN}$ varies, the input signal $V_{IN}$ will be greater than the pivot voltage at times, less than the pivot voltage at other times, and equivalent to the pivot voltage from time to time. Therefore, as the input voltage signal $V_{IN}$ varies around the pivot voltage $V_P$, the intermediate voltage signal $V_M$ also varies around the pivot voltage $V_P$.

Converter block 2 additionally includes a voltage divider stage 8 which is connected between the intermediate node $N_M$ and the pivot node $N_P$ and that generates an attenuated voltage signal $V_{ATTEN}$ in response to the difference between the intermediate voltage signal $V_M$ and the pivot voltage $N_P$.

As shown in FIG. 11, voltage divider stage 8 includes nine series-connected resistors R14A, R14B, R14C, R14D, R14E, R14F, R14G, R14H, and R14I connected between the intermediate node $N_M$ and an attenuation node $N_A$, and two parallel connected resistors R15A and R15B, connected between the attenuation node $N_A$ and the pivot node $N_P$.

Voltage divider stage 8 functions as a simple voltage divider. In operation, when the intermediate voltage signal $V_M$ varies about the pivot voltage $V_P$, an attenuated voltage signal is generated which also swings around the pivot voltage $V_P$, but with a reduced magnitude.

In FIG. 1, for example, the pivot voltage $V_P$ is set at approximately 2.1 volts as a result of the voltages across the base-emitter junctions of transistors Q1, Q12, and Q13. When the intermediate voltage signal $V_M$ and the pivot voltage $V_P$ are equivalent, such as 2.1 volts, an equivalent attenuated voltage signal is generated at the attenuation node $N_A$. When the intermediate voltage signal $V_M$ increases to 2.2 volts (compared to a 2.1 volt pivot voltage), the attenuated voltage signal $V_{ATTEN}$ increases to approximately 2.105 volts. Similarly, when the intermediate voltage signal $V_M$ decreases to 2.0 volts, the attenuated voltage signal $V_{ATTEN}$ decreases to 2.095 volts.

In addition, when the intermediate voltage signal $V_M$ and the pivot voltage $V_P$ are different, a divider current $I_D$ is generated which flows through the voltage divider stage. When the voltage of the intermediate voltage signal $V_M$ is greater than the pivot voltage $V_P$, divider current $I_D$ flows away from the intermediate node $N_M$ into the pivot node $N_P$. Similarly, when the intermediate voltage signal $V_M$ is less than the pivot voltage $V_P$, divider current $I_D$ flows from the pivot node $N_P$ into the intermediate node $N_M$.

Converter block 2 further includes a second voltage-follower stage 10 that generates an attenuated input voltage signal $V_{AIV}$ in response to the attenuated voltage signal $V_{ATTEN}$. Voltage-follower 10, which is also well-known in the art, provides a high input impedance to isolate divider current $I_D$ of voltage divider stage 8 from the remainder of converter block 2 as well as wide bandwidth and no D.C. voltage level shift. As a result, the attenuated input voltage signal $V_{AIV}$ is substantially equivalent to the attenuated voltage signal $V_{ATTEN}$.

Converter block 2 also includes a transconductance stage 12 that generates an exponential control current $I_C$ in response to the attenuated input voltage signal $V_{AIV}$. As stated above, the exponential control current is utilized to control the frequency of the oscillator output signal.

As shown in FIG. I, transconductance stage 12 commonly utilizes a bipolar transistor, such as transistor Q29, as an exponential transconductance amplifier to generate the exponential control current $I_C$. It is the high transconductance of a bipolar transistor (small changes in the base voltage produce large changes in the collector current) that necessitates the voltage gain reduction provided by voltage divider stage 8.

One problem with converter block 2 is the extensive circuitry that is required to generate the attenuated input voltage signal $V_{AIV}$ from the input voltage signal $V_{IN}$, particularly the need for a second voltage-follower stage 10 to isolate voltage divider stage 8 from transconductance stage 12. The presence of second voltage-follower stage 10 increases both the power consumed and the circuit area required by converter block 2.

Thus, there is a need for an attenuating voltage-follower circuit that can generate an attenuated input voltage signal without the second voltage-follower stage, thereby significantly reducing both the power consumed by the converter block and the circuit area required for the converter block.

SUMMARY OF THE INVENTION

The present invention provides an attenuating voltage-follower circuit that utilizes compensation circuitry in combination with simple buffer, voltage divider, and reference voltage circuitry to generate an attenuated voltage signal that swings about a reference voltage.

An attenuating voltage-follower circuit in accordance with the present invention includes an input stage that generates an intermediate voltage signal and that sources an intermediate current in response to an input voltage signal and an input stage bias current. The intermediate voltage signal can be, for example, substantially equivalent to the input voltage signal. An input biasing stage sources the input stage bias current. A reference stage generates a pivot voltage and sinks a substantially constant pivot current. The pivot current comprises a compensation current and a divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current. A correction stage sources the compensation current, controls the magnitude of the compensation current by sensing the magnitude and direction of the divider current, and sinks a buffer current in response to the compensation current. The buffer current comprises the intermediate current and the divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current. A voltage divider stage generates the attenuated voltage signal and sources the divider current in response to a difference between the intermediate voltage signal and the pivot voltage. The attenuated voltage signal is generated about the pivot voltage.

In operation, when the intermediate voltage signal is greater than the pivot voltage, the divider current reduces the compensation current by an amount. This causes the buffer current to be decreased by a corresponding amount, thereby resulting in a substantially constant intermediate current. Similarly, when the intermediate voltage is less than the pivot voltage, the compensation current increases by an amount to source both the divider current and the pivot current. This causes the buffer current to be increased by a corresponding amount, thereby resulting in a substantially constant intermediate current.

The correction stage can include a current sink stage that sinks a buffer current and a compensation stage that sources the compensation current, that senses the magnitude and direction of the divider current, and that controls the magnitude of the buffer current sunk by the current sink stage in response to the magnitude and direction of the divider current.

The compensation stage can include, for example, a current mirror that accepts a first current as input and that sources a control current as output that controls the magnitude of the buffer current, where the magnitude of the control current tracks the magnitude of the first current. The compensation stage can also include a tracking transistor that sinks the first current and that sources the compensation current in response to the divider current. The magnitude of the compensation current is equivalent to the sum of the pivot current and the divider current.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
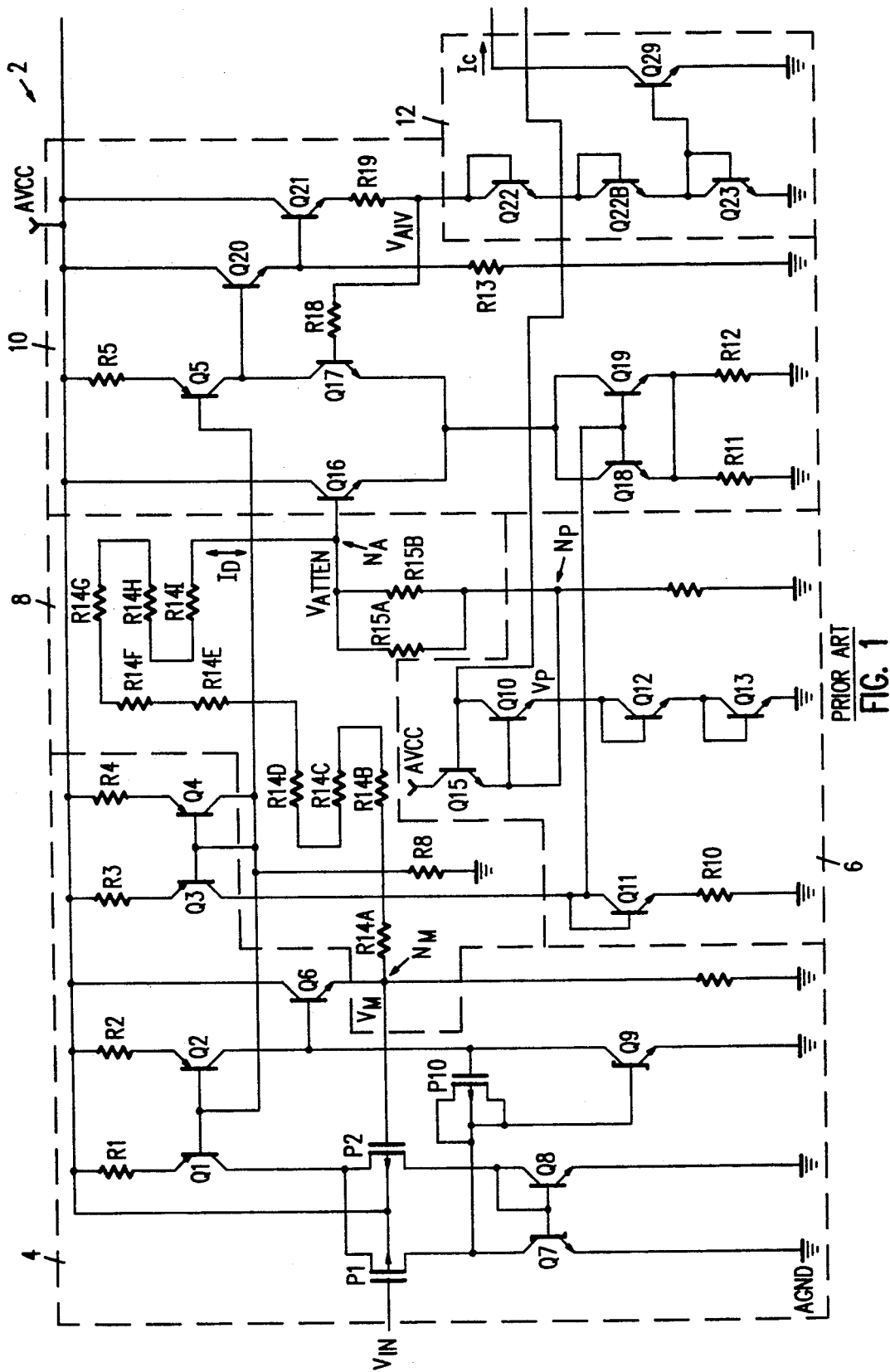
FIG. 1 shows a schematic diagram of a portion of a conventional converter block 2.
Figure 2:
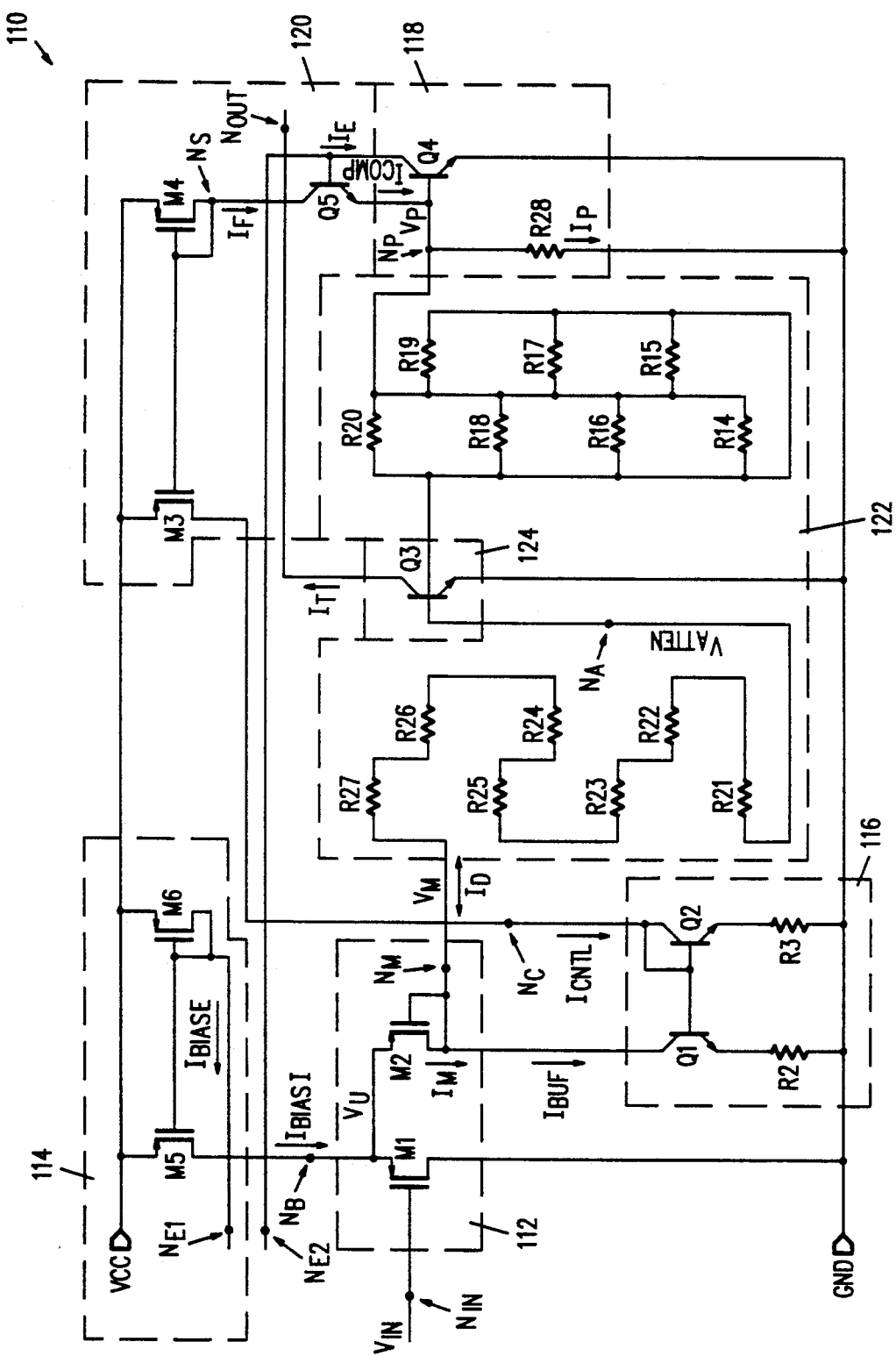
FIG. 2 shows a schematic diagram of an attenuating voltage-follower circuit 110 in accordance with the present invention.

FIG. 2 shows a schematic diagram of an attenuating voltage follower circuit 110 in accordance with the present invention. As described in greater detail below, circuit 110 utilizes compensation circuitry in combination with simple buffer, voltage divider, and reference voltage circuitry to generate an attenuated voltage signal that swings about a reference voltage.

As shown in FIG. 2, circuit 110 includes an input stage 112 that generates an intermediate voltage signal $V_M$ and that sources an intermediate current $I_M$ in response to an input voltage signal $V_{IN}$ and an input stage bias current $I_{BIAS1}$. In the preferred embodiment, the intermediate voltage signal $V_M$ is substantially equivalent to the input voltage signal $V_{IN}$.

Input stage 112 includes two substantially equivalent p-channel transistors M1 and M2. Transistor M1 has its source connected to a bias node $N_B$, its drain connected to ground GND, and its gate connected to an input node $N_{IN}$. Transistor M2 has its source connected to the bias node $N_B$ and both its drain and its gate connected to an intermediate node $N_M$.

As described in greater detail below, transistors M1 and M2 sink a substantially equivalent portion of the input stage bias current $I_{BIAS1}$. In response, transistor M1 sources a drain current to ground GND while transistor M2 sources the intermediate current $I_M$ which is substantially equivalent to the input stage bias current $I_{BIAS1}$ sunk by transistor M1. The sinking of substantially equivalent portions of the input stage bias current $I_{BIAS1}$ equally biases transistors M1 and M2 so that the source-gate voltages of both transistors M1 and M2 are substantially equivalent.

Transistor M1 is connected in a source-follower configuration. In a source-follower configuration, the voltage at the gate of a transistor is reproduced at its source plus or minus the voltage across its source-gate junction, depending on whether a p-channel or a n-channel transistor is utilized, respectively. Thus, transistor M1 generates a step up voltage $V_U$ at the bias node $N_B$ which is equivalent to the input voltage signal $V_{IN}$ plus a first offset voltage which is equivalent to the source-gate voltage of transistor M1.

Transistor M2, which is connected as a diode, generates the intermediate voltage signal $V_M$ which is equivalent to the step up voltage $V_U$ less a second offset voltage which is equivalent to the source-gate voltage of transistor M2. Since the source-gate voltages of transistors M1 and M2 are substantially equivalent, the intermediate voltage signal $V_M$ is substantially equivalent to the input voltage signal $V_{IN}$. Alternately, transistors M1 and M2 can be differently biased so that the intermediate voltage signal $V_M$ is equivalent to the input voltage signal $V_{IN}$ plus or minus a D.C. voltage level shift.

Circuit 110 further includes an input biasing stage 114 that sources the input stage bias current $I_{BIAS1}$. Input biasing stage 114 includes two substantially equal p-channel transistors M5 and M6. Transistor M5 has its source connected to a power supply VCC, its drain, which sources the input stage bias current $I_{BIAS1}$, connected to the bias node $N_B$, and its gate connected to an external node $N_E$.

Transistor M6 has its source connected to power supply VCC and both its drain and its gate connected to the external node $N_{E1}$. As described, transistor M6 is configured as a diode which, in response to well-known external circuitry, sources an external bias current $I_{BIASE}$.

Transistors M5 and M6 are connected in a MOS current mirror configuration. In a MOS current mirror configuration, the source-gate voltages of two or more substantially equal transistors are forced to be equal. This in turn forces the drain currents sourced by the two or more transistors to be equal.

Referring again to FIG. 2, since the gate of transistor M5 is connected to the gate of transistor M6, which is connected to the drain of transistor M6, the source gate voltages of both transistors M5 and M6 are forced to be equal. This in turn forces the drain currents of both transistors M5 and M6 to be equal.

Since the gate current sourced by transistors M5 and M6 is very small (the gate current of a MOS transistor is essentially zero), the drain current sourced by transistor M6 is substantially equivalent to the external bias current $I_{BIASE}$. Thus, the input stage bias current $I_{BIAS1}$ sourced at the drain of transistor M5 is substantially equivalent to the external bias current $I_{BIASE}$. Therefore, by controlling the magnitude of the external bias current $I_{BIAS1}$, the magnitude of the input stage bias current $I_{BIAS1}$ can also be controlled.

Circuit 110 additionally includes a current sink stage 116 that sinks a buffered current $I_{BUF}$. The buffered current $I_{BUF}$ includes the intermediate current $I_M$ and a divider current $I_D$ so that, as described in greater detail below, when the intermediate voltage $V_M$ is greater than a pivot voltage $V_P$, $I_{BUF}=I_M-I_D$, when the intermediate voltage $V_M$ is less than the pivot voltage $V_P$, $I_{BUF}=I_M+I_D$, and when the intermediate voltage $V_M$ is equivalent to the pivot voltage $V_P$, $I_{BUF}=I_M$.

Current sink stage 116 includes two identical NPN transistors Q1 and Q2 and two identical resistors R2 and R3. Transistor Q1 has its collector, which sinks the buffered current $I_{BUF}$ and the divider current $I_D$, connected to an intermediate node $N_M$, its emitter connected to ground GND through resistor R2, and its base connected to a control node $N_C$. Transistor Q2 has both its collector and base connected to the control node $N_C$ and its emitter connected to ground GND through resistor R3. As described, transistor Q2 is configured as a diode which sinks a control current $I_{CNTL}$. Resistors R2 and R3 are utilized to improve the matching tolerances between transistors Q1 and Q2.

Transistors Q1 and Q2 are connected in a bipolar current mirror configuration. In a bipolar current mirror configuration, the base-emitter voltages of two or more transistors are forced to be equal. This in turn forces the collector currents sourced by the two or more transistors to be equal.

Referring again to FIG. 2, since the base of transistor Q1 is connected to the base of transistor 2, which is connected to the collector of transistor Q2, the base-emitter voltages of both transistors Q1 and Q2 are forced to be equal. This in turn forces the collector currents of both transistors Q1 and Q2 to be equal.

Since the base current sunk by transistors Q1 and Q2 is very small (transistors Q1 and Q2 are NPN transistors with a relatively high beta), the collector current sunk by transistor Q2 is substantially equivalent to the control current $I_{CNTL}$. Thus, the buffer current $I_{BUF}$ sunk at the collector of transistor Q1 is substantially equivalent to the control current $I_{CNTL}$. Therefore, by controlling the magnitude of the control current $I_{CNTL}$, the magnitude of the buffered current $I_{BUF}$ can also be controlled.

As stated above, to remain equivalently biased, transistors M1 and M2 must sink a substantially equal portion of the input stage bias current $I_{BIAS1}$. Since the buffer current includes only the intermediate current $I_M$ when the intermediate voltage $V_M$ is equivalent to the pivot voltage $V_P$ and since the buffer current $I_{BUF}$ mirrors the control current $I_{CNTL}$, by setting the control current $I_{CNTL}$ to be equivalent to approximately one-half of the input stage bias current $I_{BIAS1}$ when the intermediate voltage $V_M$ is equivalent to the pivot voltage $V_P$, transistor Q1 will sink approximately one half of the input stage bias current $I_{BIAS1}$ through transistor M2.

Circuit 110 further includes a reference stage 118 that generates the pivot voltage $V_P$ and that sinks a substantially constant pivot current $I_P$. A compensation current $I_{COMP}$ is equivalent to the pivot current $I_P$ and the divider current $I_D$ so that, as described in greater detail below, when the intermediate voltage $V_M$ is greater than the pivot voltage $V_P$, $I_{COMP}=I_P-I_D$, when the intermediate voltage $V_M$ is less than the pivot voltage $V_P$, $I_{COMP}=I_P+I_D$, and when the intermediate voltage $V_M$ is equivalent to the pivot voltage $V_P$, $I_{COMP}=I_P$.

Reference stage 118 includes a NPN transistor Q4 and a resistor R28. Transistor Q4 has its collector connected to a second external node $N_{E2}$, its emitter connected to ground GND, and its base connected to the pivot node $N_P$. Resistor R28 is connected between the pivot node $N_P$ and ground GND. In operation, the pivot current $I_P$ flows through resistor R28 while the base-emitter voltage of transistor Q4 sets the pivot voltage $V_P$, thereby limiting the pivot current $I_P$ flowing through resistor R28.

The pivot voltage $V_P$ is selected to represent approximately the midpoint of the range of input voltage signals $V_{IN}$. In the preferred embodiment, the input voltage signal $V_{IN}$ ranges from 0.2 to 1.2 volts around a center voltage of 0.7 volts.

Circuit 110 also includes a compensation stage 120 that sources the compensation current $I_{COMP}$, that senses the magnitude and direction of the divider current $I_D$, and that controls the magnitude of the buffer current $I_{BUF}$ sunk by the current sink stage 116 in response to the magnitude and direction of the divider current $I_D$.

Compensation stage 120 includes two substantially equivalent p-channel transistors M3 and M4 and a NPN transistor Q5. Transistor M3 has its source connected to power supply VCC, its drain, which sources control current $I_{CNTL}$, connected to the control node $N_C$, and its gate connected to a compensation node $N_S$. Transistor M4 has its source connected to power supply VCC and both its drain and its source connected to the compensation node $N_S$. Transistor M4 is configured as a diode which provides a first current $I_F$. As described in greater detail below, the magnitude of the first current depends on the magnitude of the compensation current $I_{COMP}$.

Transistors M3 and M are connected in a MOS current mirror configuration. Thus, the control current $I_{CNTL}$ sourced by transistor M3 is substantially equivalent to the first current $I_F$.

Transistor Q5 has its collector connected to the compensation node $N_S$, its emitter connected to the pivot node $N_P$, and its base connected to the second external node $N_{E2}$. Second external node $N_{E2}$ sources an external current $I_E$ which biases transistor Q5 in the active mode so that transistor Q5 sinks the first current $I_F$ and sources the compensation current $I_{COMP}$ which includes the first current $I_F$ sunk by the collector of transistor Q5 and the current sunk by the base of transistor Q5. Since transistor Q5 is an NPN transistor, the proportion of base current to collector current is small. Thus, the compensation current $I_{COMP}$ is substantially equivalent to the first current $I_F$.

As stated above, the pivot current $I_P$ is a substantially constant current that is equivalent to the compensation current $I_{COMP}$ when the intermediate voltage $V_M$ is equivalent to the pivot voltage $V_P$. Since the compensation current $I_{COMP}$ is substantially equivalent to the first current $I_F$ which is mirrored by the control current $I_{CNTL}$ which, as stated above, is mirrored by the buffer current $I_{BUF}$, by setting the pivot current $I_P$ to be equal to approximately one half of the input stage bias current $I_{BIAS1}$ when the intermediate voltage $V_M$ and the pivot voltage $V_P$ are equivalent, transistor Q1 will sink approximately one half of the input stage bias current $I_{BIAS1}$, thereby maintaining an equivalent bias on transistors M1 and M2.

As described in greater detail below, when the magnitude and direction of the divider current $I_D$ changes, the magnitude of the compensation current $I_{COMP}$ inversely changes by a corresponding amount. Thus, compensation stage 120 senses the magnitude and direction of the divider current $I_D$ by sensing the corresponding change in the compensation current $I_{COMP}$.

In addition, transistor Q5 functions to maintain a constant voltage potential at the pivot node $N_P$ via the base of transistor Q4. For example, when the voltage at the base of transistor Q4 increases, the voltage at the collector of transistor Q4 decreases as transistor Q4 attempts to sink a greater external current $I_E$. However, when the voltage at the collector of transistor Q4 decreases, the voltage at the base of transistor Q5 also decreases which causes the voltage at the emitter of transistor Q5 to also decrease. Thus, the decreasing voltage at the emitter of transistor Q5 offsets the increasing voltage at the base of transistor Q4.

Circuit 110 also includes a voltage divider stage 122 that generates an attenuated voltage signal $V_{ATTEN}$ and that provides the divider current $I_D$ in response to a difference between the intermediate voltage signal $V_M$ and the pivot voltage $V_P$. Voltage divider stage 122 includes seven series connected resistors R21, R22, R23, R24, R25, R26, and R27, connected between the intermediate node $N_M$ and an attenuation node $N_A$, and seven parallel connected resistors R14, R15, R16, R17, R18, R19, and R20, connected between the attenuation node $N_A$ and a pivot node $N_P$.

Voltage divider stage 122 functions as a simple voltage divider which generates the attenuated voltage $V_{ATTEN}$ at the attenuated node $N_A$. The value of the attenuated voltage signal $V_{ATTEN}$ can be determined by:

$$V_{ATTEN} = (V_M - V_P)\left(\frac{R_Y}{R_X + R_Y}\right) + V_P$$

where $R_Y$ is equivalent to the parallel connected resistors R14, R15, R16, R17, R18, R19, and R20, and $R_X$ is equivalent to the series connected resistors R21, R22, R23, R24, R25, R26, and R27.

Similarly, the divider current $I_D$ can be determined by:

$$I_D = \frac{(V_M - V_P)}{(R_X + R_Y)}$$

where a positive value indicates current flow into the pivot node $N_P$ and a negative value indicates current flow into the intermediate node $N_M$.

In the preferred embodiment, each of the seven series connected resistors R21, R22, R23, R24, R25, R26, and R27, and each of the seven parallel connected resistors R14, R15, R16, R17, R18, R19, and R20, has a resistance of approximately 7K$\Omega$. Thus, in the preferred embodiment, voltage divider stage 122 provides approximately a 50:1 attenuation.

Although each resistance is approximately 7K$\Omega$, the exact value of the resistance is immaterial as long as all resistors have the same value. When a voltage divider is connected as described above, any resistance value will produce a 50:1 attenuation. In integrated circuit fabrication, those skilled in the art know that resistors can be matched with a greater precision than the fabrication of a specific resistor value. Alternately, other resistor values and/or ratios can be utilized to provide differing degrees of attenuation.

As stated above, the pivot voltage $V_P$ is selected to represent the approximate midpoint of the range of input voltage signals $V_{IN}$. Thus, as the input voltage signal $V_{IN}$ varies, the intermediate voltage signal $V_M$ swings around the pivot voltage $V_P$ which, as a result, causes the attenuated voltage signal $V_{ATTEN}$ to swing around the pivot voltage $V_P$ with a magnitude reduced by approximately 50 times.

For example, when the intermediate voltage signal $V_M$ and the pivot voltage $V_P$ have an equivalent voltage, such as 0.7 volts, an equivalent attenuated voltage signal is generated. When the intermediate voltage signal $V_M$ increases to 0.8 volts (compared to a 0.7 volt pivot voltage $V_P$), the attenuated voltage signal increases to 0.702 volts. Similarly, when the intermediate voltage signal $V_M$ decreases to 0.6 volts, the attenuated voltage signal increases to 0.698 volts.

In addition, when the intermediate voltage signal $V_M$ and the pivot voltage $V_P$ are different, divider current $I_D$ is generated. When the voltage of the intermediate voltage signal $V_M$ is greater than the pivot voltage $V_P$, divider current $I_D$ flows away from the intermediate node $N_M$ into the pivot node $N_P$, thereby increasing the flow of current away from the intermediate node $N_M$. Since the current flowing into the intermediate node $N_M$ is indirectly supplied by the input stage bias current $I_{BIAS1}$ as the intermediate current $I_M$, when the flow of current away from the intermediate node $N_M$ is increased, the magnitude of the input stage bias current $I_{BIAS1}$ sunk by transistor M2 is also increased by a corresponding amount. Thus, if this condition were allowed to remain, transistor M2 would sink an increased portion of the input stage bias current $I_{BIAS1}$, thereby changing the bias of transistors M1 and M2. As a result, the intermediate voltage $V_M$ would no longer accurately track the input voltage signal $V_{IN}$.

Similarly, when the intermediate voltage signal $V_M$ is less than the pivot voltage $V_P$, divider current $I_D$ flows from the pivot node $N_P$ into the intermediate node $N_M$, thereby increasing the flow of current into the intermediate node $N_M$. When the flow of current into the intermediate node $N_M$ is increased, the portion of the input stage bias current $I_{BIAS1}$ sunk by transistor M2 is decreased, thereby also changing the bias of transistors M1 and M2.

In the operation of circuit 110, when the divider current $I_D$ flows away from the intermediate node $N_M$ to the pivot node $N_P$ (when the voltage of the intermediate voltage signal $V_M$ is greater than the pivot voltage $V_P$), the divider current $I_D$ also increases the current flowing into the pivot node $N_P$. Since the magnitude of the pivot current $I_P$ is substantially constant, the magnitude of the compensation current $I_{COMP}$ is decreased by a corresponding amount. Since the magnitude of the buffered current $I_{BUF}$ is substantially equivalent to the magnitude of the control current $I_{CNTL}$, which is substantially equivalent to the magnitude of the compensation current $I_{COMP}$, when the magnitude of the compensation current $I_{COMP}$ decreases, the magnitude of the buffered current $I_{BUF}$ decreases by a corresponding amount. Thus, the increased current flowing away from the intermediate node $N_M$ as a result of the divider current $I_D$ is compensated for by reducing the buffered current $I_{BUF}$ flowing away from the intermediate node $N_M$.

For example, if the voltage of the intermediate voltage signal $V_M$ increases to 0.8 volts (against a pivot voltage $V_P$ of 0.7 volts), a divider current $I_D$ of approximately 2 $\mu$A flows into the pivot node $N_P$. As a result, the compensation current $I_{COMP}$ is reduced by approximately 2 $\mu$A, which then reduces the buffered current $I_{BUF}$ by 2 $\mu$A, thereby allowing transistor M2 to sink a substantially constant input stage bias current $I_{BIAS1}$.

Similarly, if the voltage of the intermediate voltage signal $V_M$ decreases to 0.6 volts, a divider current $I_D$ of approximately 2 $\mu$A flows into the intermediate node $N_M$. As a result, the compensation current $I_{COMP}$ is increased by approximately 2 $\mu$A which then increases the buffered current $I_{BUF}$ by 2 $\mu$A, thereby also allowing transistor M2 to sink a substantially constant input stage bias current $I_{BIAS1}$.

As shown in FIG. 2, in the preferred embodiment, circuit 110 further includes a transconductance stage 124 that sources a transconductance current $I_T$ to control the frequency of an external oscillator signal in response to the attenuated voltage signal $V_{ATTEN}$. The transconductance stage 124 includes a npn transistor Q3 that has its collector connected to an output node $N_{OUT}$, its emitter connected to ground GND, and its base connected to the attenuation node $N_A$. In the preferred embodiment, transistor Q3 is formed with a high beta so that substantially no divider current $I_D$ is sunk as base current by transistor Q3.

Transistors Q3 and Q4 are connected in a bipolar quasi-current mirror configuration. Because the base voltage of transistor Q3 pivots about the base voltage of transistor Q4 (as an attenuated function of input voltage signal $V_{IN}$), the collector current of transistor Q3 pivots about a nominal collector current established in transistor Q4 by external current $I_E$. Thus, by setting the external current $I_E$, the midpoint of the transconductance current $I_T$ can be set.

It should be understood that various alternatives to the structures described herein may be employed in practicing the present invention. It is intended that the following claims define the invention and that structures within the scope of these claims and their equivalents be covered thereby.

What is claimed is:

1. A voltage-follower circuit for generating an attenuated signal about a reference voltage, the voltage-follower circuit comprising:

an input stage that generates an intermediate voltage signal and that sources an intermediate current in response to an input voltage signal and an input stage bias current;

an input biasing stage connected to the input stage that sources the input stage bias current;

a reference stage that generates a pivot voltage and that sinks a substantially constant pivot current, the pivot current comprising a compensation current and a divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current;

a correction stage connected to the input stage and to the reference stage and that sources the compensation current, that controls the magnitude of the compensation current by sensing the magnitude and direction of the divider current, and that sinks a buffer current in response to the compensation current, the buffer current comprising the intermediate current and the divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current; and a voltage divider stage connected to the input stage, the correction stage, and the reference stage and that generates an attenuated voltage signal and that sources the divider current in response to a difference between the intermediate voltage signal and the pivot voltage, the attenuated voltage signal being generated about the pivot voltage, whereby when the intermediate voltage is greater than the pivot voltage, the divider current reduces the compensation current by an amount which causes the buffer current to be decreased by a corresponding amount, thereby resulting in a substantially constant intermediate current, and whereby when the intermediate voltage is less than the pivot voltage, the compensation current increases by an amount to source both the divider current and the pivot current which causes the buffer current to be increased by a corresponding amount, thereby resulting in a substantially constant intermediate current.

2. The circuit of claim 1 wherein the correction stage comprises:

a current sink stage connected to the input stage and the voltage divider stage that sinks the buffer current; and a compensation stage connected to the reference stage, the voltage divider stage, and the current sink stage and that sources the compensation current, that senses a magnitude and direction of the divider current, and that controls the magnitude of the buffer current sunk by the current sink stage in response to the magnitude and direction of the divider current.

3. The circuit of claim 2 wherein the compensation stage comprises:
 a current mirror that accepts a first current as input and that sources a control current as output and that controls the magnitude of the buffer current, the magnitude of the control current tracking the magnitude of the first current; and
 a tracking transistor that sinks the first current and that sources the compensation current in response to the divider current, the magnitude of the compensation current being the sum of the pivot current and the divider current.

4. The circuit of claim 3 wherein the intermediate voltage signal is substantially equivalent to the input voltage signal.

5. The circuit of claim 4 wherein the input stage comprises:
 a source follower transistor having its source connected to the input biasing stage, its drain connected to ground, and its gate connected to an input node; and
 a diode-connected transistor having its source connected to the source of the source-follower transistor and both its drain and its gate connected to the current sink stage and the voltage divider stage.

6. The circuit of claim 5 and further comprising a transconductance stage that sources a transconductance current in response to the attenuated voltage signal.

7. A voltage-follower circuit for generating an attenuated signal about a reference voltage, the voltage-follower circuit comprising:
 input stage means for generating an intermediate voltage signal and for sourcing an intermediate current in response to an input voltage signal and an input stage bias current;
 input biasing stage means connected to the input stage for sourcing the input stage bias current;
 reference stage means for generating a pivot voltage and for sinking a substantially constant pivot current, the pivot current comprising a compensation current and a divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current;
 correction stage means connected to the input stage and the reference stage for sourcing the compensation current, for controlling the magnitude of the compensation current by sensing the magnitude and direction of the divider current, and for sinking a buffer current in response to the compensation current, the buffer current comprising the intermediate current and the divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current; and
 voltage divider stage means connected to the input stage, the correction stage, and the reference stage for generating an attenuated voltage signal and for sourcing the divider current in response to the difference between the intermediate voltage signal and the pivot voltage, the attenuated voltage signal being generated about the pivot voltage,
 whereby when the intermediate voltage is greater than the pivot voltage, the divider current reduces the compensation current by an amount which causes the buffer current to be decreased by a corresponding amount, thereby resulting in a substantially constant intermediate current, and
 whereby when the intermediate voltage is less than the pivot voltage, the compensation current increases by an amount to source both the divider current and the pivot current which causes the buffer current to be increased by a corresponding amount, thereby resulting in a substantially constant intermediate current.

8. The circuit of claim 7 wherein the correction stage means comprises:
 current sink stage means connected to the input stage and the voltage divider stage for sinking the buffer current; and
 compensation stage means connected to the reference stage, the voltage divider stage, and the current sink stage for sourcing the compensation current, for sensing the magnitude and direction of the divider current, and for controlling the magnitude of the buffer current sunk by the current sink stage in response to the magnitude and direction of the divider current.

9. The circuit of claim 8 wherein the compensation stage means comprises:
 a current mirror that accepts a first current as input and that sources a control current as output that controls the magnitude of the buffer current, the magnitude of the control current tracking the magnitude of the first current; and
 a tracking transistor that sinks the first current and that sources the compensation current in response to the divider current, the magnitude of the compensation current being the sum of the pivot current and the divider current.

10. The circuit of claim 9 wherein the intermediate voltage signal is substantially equivalent to the input voltage signal.

11. The circuit of claim 10 wherein the input stage means comprises:
 a source-follower transistor having its source connected to the input biasing stage, its drain connected to ground, and its gate connected to an input node; and
 a diode-connected transistor having its source connected to the source of the source-follower transistor and both its drain and its gate connected to the current sink stage and the voltage divider stage.

12. The circuit of claim 11 and further comprising transconductance stage means for sourcing a transconductance current in response to the attenuated voltage signal.

13. A voltage-follower circuit for generating an attenuated signal about a reference voltage, the voltage-follower circuit comprising:

an input stage that generates an intermediate voltage signal and that sources an intermediate current in response to an input voltage signal and an input stage bias current;

an input biasing stage connected to the input stage that sources the input stage bias current;

a current sink stage connected to the input stage that sinks a buffer current, the buffer current comprising the intermediate current and a divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current;

a reference stage that generates the pivot voltage and that sinks a substantially constant pivot current, the pivot current comprising a compensation current and the divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current;

a compensation stage connected to the reference stage and the current sink stage that sources the compensation current, that senses a magnitude and direction of the divider current, and that controls the magnitude of the buffer current sunk by the current sink stage in response to the magnitude and direction of the divider current; and a voltage divider stage connected to the input stage, the current sink stage, the compensation stage, and the reference stage that generates an attenuated voltage signal and that sources the divider current in response to a difference between the intermediate voltage signal and the pivot voltage, the attenuated voltage signal being generated about the pivot voltage, whereby when the intermediate voltage is greater than the pivot voltage, the divider current reduces the compensation current by an amount which causes the buffer current to be decreased by a corresponding amount, thereby resulting in a substantially constant intermediate current, and whereby when the intermediate voltage is less than the pivot voltage, the compensation current increases by an amount to source both the divider current and the pivot current which causes the buffer current to be increased by a corresponding amount, thereby resulting in a substantially constant intermediate current.

14. The circuit of claim 13 wherein the compensation stage comprises:

a current mirror that accepts a first current as input and that sources a control current as output and that controls the magnitude of the buffer current, the magnitude of the control current tracking the magnitude of the first current; and a tracking transistor that sinks the first current and that sources the compensation current in response to the divider current, the magnitude of the compensation current being the sum of the pivot current and the divider current.

15. The circuit of claim 14 wherein the intermediate voltage signal is substantially equivalent to the input voltage signal.

16. The circuit of claim 15 wherein the input stage comprises:

a source-follower transistor having its source connected to the input biasing stage, its drain connected to ground, and its gate connected to an input node; and a diode-connected transistor having its source connected to the source of the source-follower transistor and both its drain and its gate connected to the current sink stage and the voltage divider stage.

17. The circuit of claim 16 and further comprising a transconductance stage that sources a transconductance current in response to the attenuated voltage signal.

18. The circuit of claim 13 and further comprising a transconductance stage that sources a transconductance current in response to the attenuated voltage signal.

19. A method for generating an attenuated signal about a reference voltage, the method comprising the steps of:

providing an input voltage signal;

sourcing an input stage bias current;

generating an intermediate voltage signal and sourcing an intermediate current in response to the input voltage signal and the input stage bias current;

sinking a buffer current, the buffer current comprising the intermediate current and a divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current;

generating the pivot voltage and sinking a substantially constant pivot current, the pivot current comprising a compensation current and the divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current;

sourcing the compensation current, sensing the magnitude and direction of the divider current, and controlling a magnitude of the buffer current sunk by the current sink stage in response to the magnitude and direction of the divider current; and generates an attenuated voltage signal and sourcing the divider current in response to a difference between the intermediate voltage signal and the pivot voltage, the attenuated voltage signal being generated about the pivot voltage, whereby when the intermediate voltage is greater than the pivot voltage, the divider current reduces the compensation current by an amount which causes the buffer current to be decreased by a corresponding amount, thereby resulting in a substantially constant intermediate current, and whereby when the intermediate voltage is less than the pivot voltage, the compensation current increases by an amount to source both the divider current and the pivot current which causes the buffer current to be increased by a corresponding amount, thereby resulting in a substantially constant intermediate current.

20. A voltage-follower circuit for generating an attenuated signal about a reference voltage, the voltage-follower circuit comprising:

- an input stage that generates an intermediate voltage signal and for sourcing an intermediate current in response to an input voltage signal and an input stage bias current;
- an input biasing stage that sources the input stage bias current;
- a current sink stage that sinks a buffer current, the buffer current comprising the intermediate current and a divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current;
- a reference stage that generates the pivot voltage and sinks a substantially constant pivot current, the pivot current comprising a compensation current and the divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current;
- a compensation stage that sources the compensation current, senses the magnitude and direction of the divider current, and controls the magnitude of the buffer current sunk by the current sink stage in response to the magnitude and direction of the divider current; and
- a voltage divider stage that generates an attenuated voltage signal and sources the divider current in response to a difference between the intermediate voltage signal and the pivot voltage, the attenuated voltage signal being generated about the pivot voltage,
- whereby when the intermediate voltage is greater than the pivot voltage, the divider current reduces the compensation current by an amount which causes the buffer current to be decreased by a corresponding amount, thereby resulting in a substantially constant intermediate current, and
- whereby when the intermediate voltage is less than the pivot voltage, the compensation current increases by an amount to source both the divider current and the pivot current which causes the buffer current to be increased by a corresponding amount, thereby resulting in a substantially constant intermediate current.

21. The circuit of claim 20 wherein the compensation stage comprises:

- a current mirror that accepts a first current as input and sources a control current as output that controls the magnitude of the buffer current, the magnitude of the control current tracking the magnitude of the first current; and
- a tracking transistor that sinks the first current and sources the compensation current in response to the divider current, the magnitude of the compensation current being equivalent to the sum of the pivot current and the divider current.

22. The circuit of claim 21 wherein the intermediate voltage signal is substantially equivalent to the input voltage signal.

23. A voltage-follower circuit for generating an attenuated signal about a reference voltage, the voltage-follower circuit comprising:

- an input stage that generates an intermediate voltage signal and sources an intermediate current in response to an input voltage signal and an input stage bias current, the intermediate voltage signal being substantially equivalent to the input voltage signal;
- an input biasing stage that sources the input stage bias current;
- a current sink stage that sinks a buffer current, the buffer current comprising the intermediate current and a divider current so that when the intermediate voltage is greater than a pivot voltage, the buffer current equals the intermediate current minus the divider current, when the intermediate voltage is less than the pivot voltage, the buffer current equals the intermediate current plus the divider current, and when the intermediate voltage is equivalent to the pivot voltage, the buffer current equals the intermediate current;
- a reference stage that generates the pivot voltage and sinks a substantially constant pivot current, the pivot current comprising a compensation current and the divider current so that when the intermediate voltage is greater than the pivot voltage, the compensation current equals the pivot current minus the divider current, when the intermediate voltage is less than the pivot voltage, the compensation current equals the pivot current plus the divider current, and when the intermediate voltage is equivalent to the pivot voltage, the compensation current is equal to the pivot current;
- a compensation stage that sources the compensation current, senses a magnitude and direction of the divider current, and controls the magnitude of the buffer current sunk by the current sink stage in response to the magnitude and direction of the divider current; and
- a voltage divider stage that generates an attenuated voltage signal and sources the divider current in response to a difference between the intermediate voltage signal and the pivot voltage, the attenuated voltage signal being generated about the pivot voltage,
- whereby when the intermediate voltage is greater than the pivot voltage, the divider current reduces the compensation current by an amount which causes the buffer current to be decreased by a corresponding amount, thereby resulting in a substantially constant intermediate current, and
- whereby when the intermediate voltage is less than the pivot voltage, the compensation current increases by an amount to source both the divider current and the pivot current which causes the buffer current to be increased by a corresponding amount, thereby resulting in a substantially constant intermediate current.

24. The circuit of claim 23 wherein the compensation stage comprises:
 a current mirror that accepts a first current as input and sources a control current as output that controls the magnitude of the buffer current, the magnitude of the control current tracking the magnitude of the first current; and
 a tracking transistor that sinks the first current and sources the compensation current in response to the divider current, the magnitude of the compensation current being equivalent to the sum of the pivot current and the divider current.

25. A voltage-follower circuit for generating an attenuated signal about a reference voltage, the voltage-follower circuit comprising:
 an input stage that generates an intermediate voltage signal on an intermediate node and that sources an intermediate current into the intermediate node in response to an input voltage signal on an input node and an input stage bias current received from a bias node;
 an input biasing stage that sources the input stage bias current into the bias node;
 a reference stage that generates a pivot voltage at a pivot node and that sinks a substantially constant pivot current from the pivot node;
 a voltage divider stage that generates an attenuated voltage signal about the pivot voltage and that sources a divider current in response to a difference between the intermediate voltage signal and the pivot voltage so that when the intermediate voltage is greater than the pivot voltage, the divider current is sourced into the pivot node from the intermediate node, when the intermediate voltage is less than the pivot voltage, the divider current is sourced into the intermediate node from the pivot node, and when the intermediate voltage is equivalent to the pivot voltage, no divider current is generated; and
 a correction stage that senses the magnitude and direction of the divider current and that corrects for the magnitude and direction of the divider current by sinking a correction current from the intermediate node and by sourcing the correction current into the pivot node so that the magnitude of the pivot current and the magnitude of the intermediate current are uneffected by the magnitude and direction of the divider current,
whereby when the intermediate voltage signal is equivalent to the pivot voltage, the correction current is substantially equivalent to the pivot current, thereby setting the magnitude of the intermediate current to be substantially equivalent to the magnitude of the pivot current,
whereby when the intermediate voltage signal is greater than the pivot voltage, the divider current reduces the magnitude of the correction current sourced into the pivot node by an amount which causes the magnitude of the correction current sunk from the intermediate node to be decreased by a corresponding amount, thereby resulting in a substantially constant intermediate current and pivot current, and
whereby when the intermediate voltage signal is less than the pivot voltage, the magnitude of the correction current sourced into the pivot node increases by an amount to source both the divider current and the pivot current which causes the magnitude of the correction current sunk from the intermediate node to be increased by a corresponding amount, thereby resulting in a substantially constant intermediate current and pivot current.

* * * * *